(12) United States Patent
Chiriac

(10) Patent No.: US 7,778,030 B1
(45) Date of Patent: Aug. 17, 2010

(54) METHOD FOR COOLING USING IMPINGING JET CONTROL

(75) Inventor: Victor A. Chiriac, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/471,358

(22) Filed: May 23, 2009

(51) Int. Cl.
*H05K 7/20* (2006.01)
*H05K 5/00* (2006.01)
*A47B 77/08* (2006.01)
*F28F 7/00* (2006.01)
*H01L 23/34* (2006.01)

(52) U.S. Cl. .................. 361/695; 361/679.48; 361/691; 361/694; 454/184; 312/236; 165/80.3; 165/122; 257/712; 174/15.1; 174/16.1; 34/488

(58) Field of Classification Search ............ 361/679.48, 361/691, 694, 695; 454/184, 285; 312/236; 165/80.3, 121–126; 257/712, 713, 723, 724; 62/414, 418, 259.2; 174/15.1, 16.1; 34/229, 34/488; 29/890.035, 832
See application file for complete search history.

(56) References Cited

U.S. PATENT DOCUMENTS

| | | | |
|---|---|---|---|
| 4,741,385 A | 5/1988 | Bergles et al. | |
| 6,418,016 B1 * | 7/2002 | Chiriac et al. | 361/695 |
| 6,431,260 B1 | 8/2002 | Agonafer et al. | |
| 6,688,110 B2 * | 2/2004 | Dailey et al. | 60/752 |
| 7,283,365 B2 | 10/2007 | Craft, Jr. | |
| 2006/0164805 A1 * | 7/2006 | Meinders et al. | 361/689 |
| 2010/0053894 A1 * | 3/2010 | Chiriac | 361/695 |

FOREIGN PATENT DOCUMENTS

JP 5167282 7/1993

* cited by examiner

*Primary Examiner*—Zachary M Pape
(74) *Attorney, Agent, or Firm*—Meschkow & Gresham, P.L.C.

(57) ABSTRACT

A system (50) includes a material layer (52) having an opening (62) extending through it and a pumping device (54) positioned behind the layer (52). A target element (56) is positioned in front of the material layer (52). In a partial cooling mode (124), the pumping device (54) drives a jet (134) of coolant through the opening (62) toward the target (56). Transducers (58, 60), positioned at opposing ends of the opening (62), produce output signals (130, 132) that perturb the jet (134) to partially control its oscillation. The jet (134) spreads from a location (96) on the target element (56) in one direction (142) to provide uniform cooling over a portion (126) of the target element (56) in the direction (142), and the jet (134) non-uniformly spreads in another direction (144) to provide non-uniform cooling over a portion (128) of the target element (56) in the other direction (144).

19 Claims, 5 Drawing Sheets

METHOD FOR COOLING USING IMPINGING JET CONTROL

RELATED INVENTION

The present invention is related to "System and Method for Cooling Using Impinging Jet Control," by Victor A. Chiriac, U.S. patent application Ser. No. 12/201,932, filed 29 Aug. 2008, which is incorporated by reference herein.

TECHNICAL FIELD OF THE INVENTION

The present invention relates generally to electrical equipment. More specifically, the present invention relates to a method for cooling microelectronic devices.

BACKGROUND OF THE INVENTION

Maintaining electrical devices and equipment within specified temperatures is an important requirement for maintaining the operability of those devices. In the field of microelectronics, for example, microchips such as microprocessors must be maintained at or below maximum temperatures during operation to prevent self-destruction of the microchips. Recent and continuing increases in the processing power and operating speeds of microchips has led to increases in the power dissipation of those microchips. For example, new high-powered chips can dissipate at least 10 Watts of power per chip and have heat fluxes of at least 500 W/cm$^2$. Consequently, the cooling of microchips during their operation is becoming even more critical as the performance of those microchips becomes even greater.

Numerous techniques for cooling currently exist. With respect to the cooling of microchips in particular, many existing cooling techniques incorporate large and costly heat spreaders and heat sinks, which impose limits on package size and functionality. Other techniques involve directing one or more jets or streams of cool air or other gas (or liquid) at or along the one or more microchips that require cooling.

Referring to FIGS. 1 and 2, FIG. 1 shows a cross-sectional view of a prior art uncontrolled impinging jet system 20 for cooling microelectronic devices 22, and FIG. 2 shows a series of charts 24, 26, 28 representing airflow variation and vortex formation over time in the cross-sectional view of the prior art impinging jet system 20 cooling microelectronic devices 22. Impinging jet system 20 includes a jet 30 of fluid or coolant, such as air, that is generated by a pumping device 32, such as a fan or blower. Pumping device 32 drives jet 30 through an opening 34 in a material layer 36 spaced apart from an underlying target element, such as a circuit board 38. Jet 30 is directed toward circuit board 38, which supports a variety of heat generating elements such as microelectronic devices 22. In one example, jet 30 is generally directed toward one of microelectronic devices 22, referred to herein as a target 40, along an axis 42.

Jet 30 of impinging jet system 20 flows in an unsteady laminar flow mode. More particularly, jet 30 "buckles" and oscillates back and forth about axis 42 so that its central core is not always parallel to axis 42. This oscillation occurs in part due to the existence of vortices 44 (shown in FIG. 2). Vortices 44 are areas of high recirculation near opening 34 which can distort jet 30, entrain or remove some of the cool air from jet 30 exiting opening 34, and eliminate warmer air at the top of the space between material layer 36 and circuit board 38 where air exits the space. Due to this oscillation, jet 30 varies in its position relative to axis 42. In addition, a phenomenon related to the buckling occurs in which a central tip, or stagnation point 46, of jet 30 "sweeps" or moves back and forth along its target, e.g., target 40. This sweeping is represented in FIG. 1 by a bi-directional arrow 48. This sweeping is further represented in FIG. 1 by showing multiple axes 42 about which jet 30 oscillates, each of multiple axes 42 representing a different instant in time.

Stagnation point 46 is the point at which greatest pressure of jet 30 is provided against microelectronics devices 22, and is consequently where the greatest amount of cooling and maximum heat transfer coefficients occur. As a result of the sweeping motion of the tip of jet 30 across target 40, the position of stagnation point 46 moves back and forth relative to target 40 such that the portion of target 40 receiving the greatest amount of cooling varies in time. Such a phenomenon, referred to herein as an uncontrolled (or un-forced) jet technique, yields effective local cooling at target 40 but less (i.e., reduced) cooling for some remaining microelectronic devices 22 that also have high heat fluxes.

In order to provide cooling over greater areas, prior art solutions entail directing multiple steady (i.e., non-buckling) impinging jets 30 parallel to one another from respective rectangular openings 34 in material layer 36. By using multiple steady jets 30, the heat transfer coefficient may be maintained at a more uniform level over a wider region of circuit board 38, over two (or more) microelectronic devices 22. As such the temperature along a top surface of microelectronic devices 22 and circuit board 38 may be reduced over a larger area.

However, a multiple jet impinging system may still produce non-uniformities in heat transfer across the surface of circuit board 38 due to interaction between the parallel jets, thus leading to inefficiencies in cooling. Typically, material layer 36 is a circuit board with its own microelectronic devices coupled to it. Thus, multiple openings 34 in such a circuit board utilize an undesirably large amount of space that could be better served for the attachment of devices and the formation of electrically conductive traces. In addition, the inclusion of multiple openings 34 calls for additional design and manufacturing processes which drives up cost. Furthermore, the multiple openings 34 may necessitate additional pumping devices 32, thus higher energy utilization requirements, or additional structure to direct coolant flow to the multiple openings 34, further driving up costs.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Embodiments of the invention entail methodology for cooling by controlling a jet of coolant from a jet impinging system and for enabling cooling capability flexibility by controlling the impinging jet, by partially controlling the impinging jet, or by abstaining from controlling the impinging jet. Furthermore, the methodology is readily implemented and cost effectively provides a desired cooling effect. The jet impinging system and control methodology may be implemented in a variety of cooling applications for cooling high power microelectronic devices, such as memory, logic, microcontrollers, microprocessors, power amplifiers, power management modules, and so forth.

Figure 3:
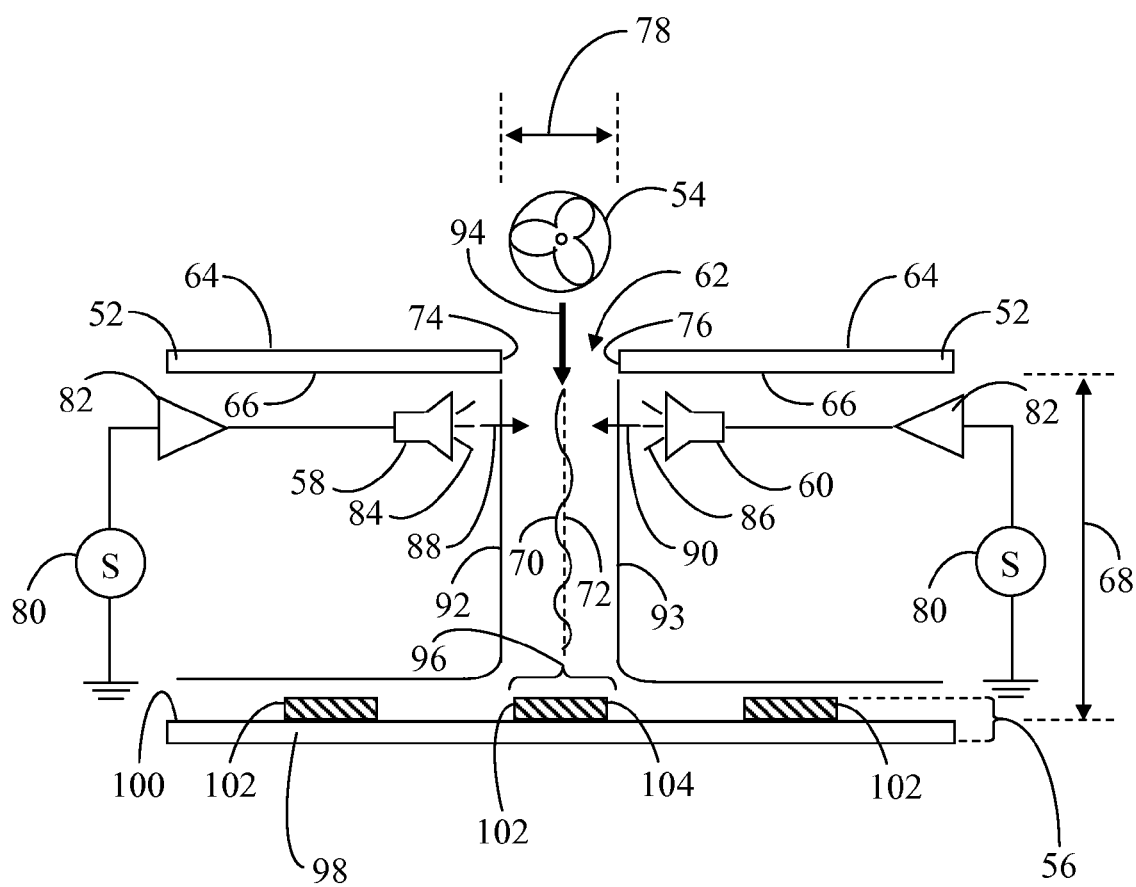
FIG. 3 shows a cross-sectional view of a controlled jet system for cooling that is operating in an overall cooling mode.

FIG. 3 shows a cross-sectional view of a controlled jet system 50 for cooling.

System 50 includes a structure, also referred to herein as a material layer 52, a pumping device 54, a target element 56, and transducers 58 and 60. An opening 62 extends through material layer 52 from an outer surface 64 to an inner surface 66 of material layer 52. Pumping device 54 is positioned in front of material layer 52 proximate outer surface 64. Target element 56 is spaced apart from inner surface 66 of material layer 52 by a predetermined distance 68. Transducers 58 and 60 are positioned between material layer 52 and target element 56, nearer to opening 62.

Pumping device 54 may be a fan, blower, or the like, that generates a jet 70 of fluid or coolant (typically air) and drives jet 70 through opening 62 in material layer 52. Jet 70 is directed toward target element 56 along its axis 72 for impingement, i.e., collision, with target element 56. In one embodiment, opening 62 is a generally rectangular slot having ends 74 and 76 that are spaced apart by a length 78 of, for example, one centimeter. Transducer 58 is positioned proximate opening 62 at end 74 and transducer 60 is positioned proximate opening 62 at end 76. Transducers 58 and 60 are driven by a signal source 80. A signal amplifier 82 may be interposed between signal source 80 and transducers 58 and 60. Transducers 58 and 60 may be speakers, microelectromechanical systems (MEMS) devices, micro-fluidic devices, piezoelectric membrane devices, and the like capable of perturbing jet 70 when actuated.

In response to actuation by signal source 80, transducers 58 and 60 produce respective output signals 84 and 86 for perturbing jet 70. More particularly, a projected direction 88 of output signal 84 faces a projected direction 90 of output signal 86 on opposing sides 92, 93 of jet 70. In addition, projected directions 88 and 90 of respective output signals 84 and 86 are generally perpendicular to a flow direction, represented by an arrow 94, of jet 70. Output signals 84 and 86 control an oscillation of jet 70 relative to axis 72 in order to stabilize jet 70 for impingement at a predetermined location 96 on target element 56 (discussed below) to provide localized cooling.

That is, jet 70 is generally concentrated at predetermined location 96 to provide maximum downward momentum of jet 70 at predetermined location 96. In addition, jet 70 spreads outwardly from predetermined location 96 in a generally uniform manner so as to provide effective overall cooling of target element 56, as opposed to the prior art uncontrolled (i.e., unforced) jet technique where primarily the local cooling is enhanced.

In one embodiment, target element 56 includes a support structure, such as a circuit board 98, having a surface 100 that faces inner surface 66 of material layer 52. Circuit board 98 supports a variety of heat generating elements, illustrated by multiple microelectronic devices 102 coupled to surface 100, to be cooled. The combined assembly of circuit board 98 and microelectronic devices 102 may be considered target element 56. In another embodiment, only microelectronic devices 102 may be considered target element 56 when circuit board 98 is formed of materials that do not allow heat transfer into circuit board 98.

As illustrated herein, one of microelectronic devices 102 may be considered a critical microelectronic device 104. Microelectronic device 104 is referred to herein as being "critical" because it generates a greater amount of heat (for which cooling is required) than the surrounding microelectronic devices 102. System 50 provides generally uniform cooling of target element 56, e.g. circuit board 98 and microelectronic devices 102. However, there is a region, i.e., predetermined location 96, that receives greater localized cooling due to a greater momentum of jet 70 at predetermined location 96. It may therefore be advantageous to configure system 50 such that critical microelectronic device 104 is positioned at predetermined location 96. However, in another embodiment, critical microelectronic device 104 need not be coupled to circuit board 98 at predetermined location 96 but may instead be displaced from predetermined location 96. In yet another embodiment, none of microelectronic devices 102 may be deemed "critical" and overall uniform cooling of target element 56 may be sufficient for providing cooling capability.

Figure 4:
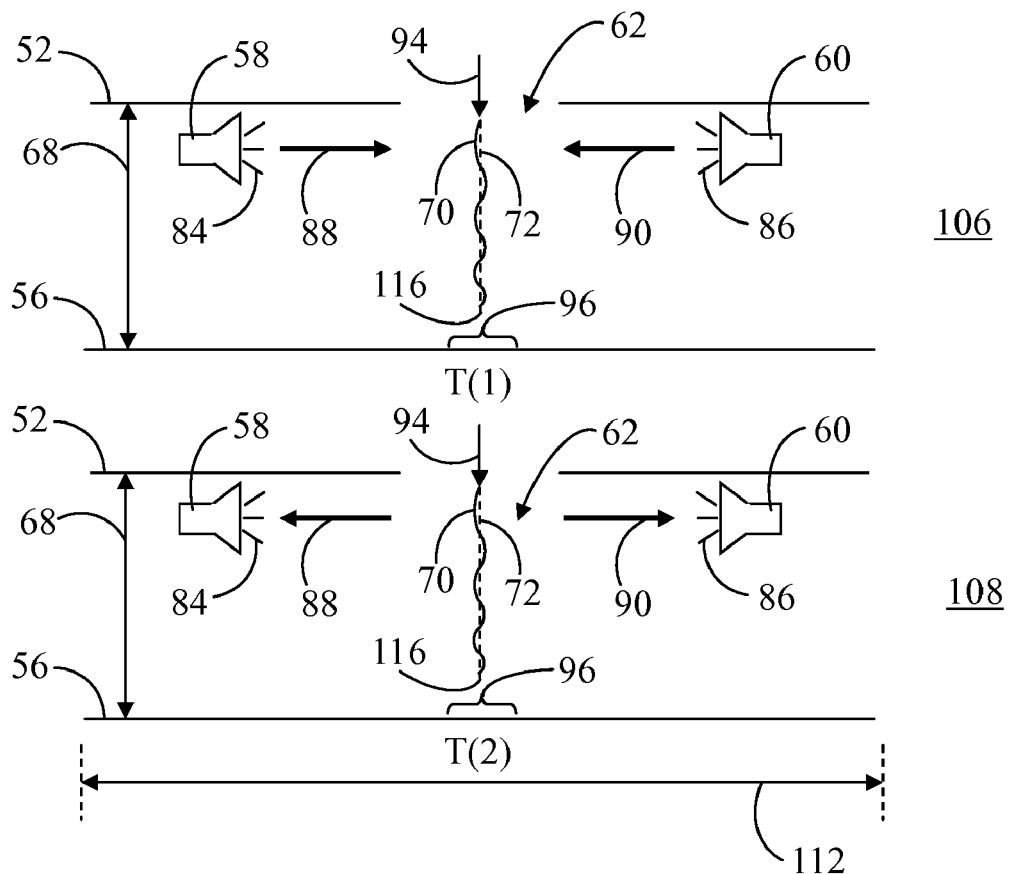
FIG. 4 shows partial cross-sectional views of the controlled jet system in time series, with transducers perturbing a jet in an out-of-phase mode.
Figure 5:
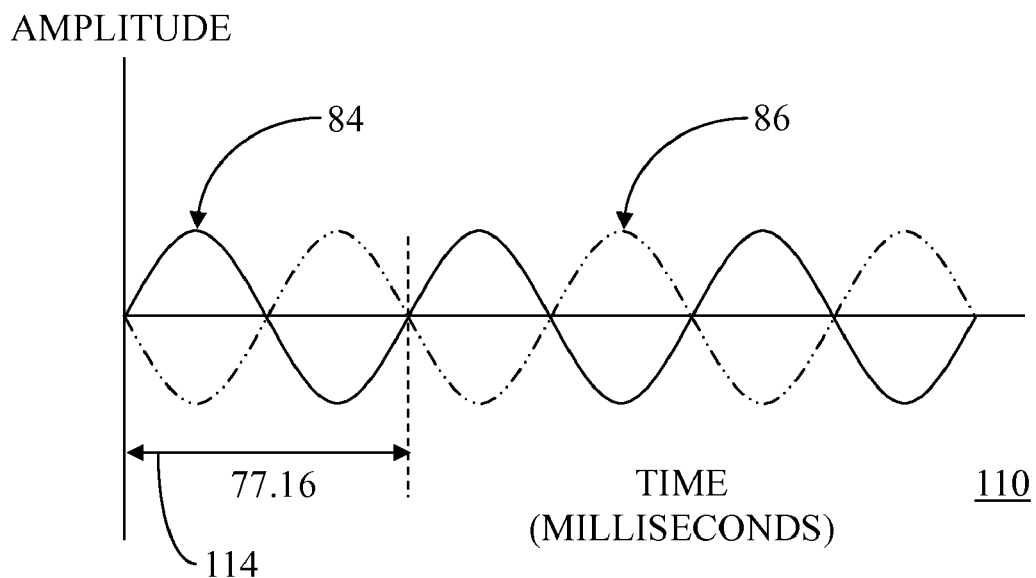
FIG. 5 shows a graph of output signals produced by the transducers of FIG. 4.

Referring to FIGS. 4 and 5, FIG. 4 shows partial cross-sectional views 106 and 108 of controlled jet system 50 (FIG. 3) in time series, with transducers 58 and 60 perturbing jet 70 of coolant in an out-of-phase mode, and FIG. 5 shows a graph 110 of output signals 84 and 86 produced by transducers 58 and 60, respectively. In an embodiment, each of output signals 84 and 86 is a sinusoidal signal corresponding to an oscillation frequency of jet 70. In addition, transducers 58 and 60 are actuated so that output signals 84 and 86 have a phase difference of approximately one hundred and eighty degrees (illustrated in FIG. 5). The out-of-phase mode is illustrated in views 106 and 108 of FIG. 4 by the arrowheads of directions 88 and 90 of respective output signals 84 and 86 pointing toward one another at one instant in time, T(1), and the arrowheads of directions 88 and 90 pointing away from one another at another instant in time, T(2).

Like jet 30 (FIG. 1) of the prior art impinging jet system 20 (FIG. 1), jet 70 flows in an unsteady laminar flow mode. That is, jet 70 "buckles" or oscillates back and forth about axis 72 so that its central core is not always parallel to axis 72. However, unlike the sweeping or flapping motion of the prior art impinging system 20 (FIG. 1), the position of jet 70 is "locked," i.e., non-varying over time (discussed below).

The unsteady laminar flow mode is a transitional mode of operation between the two normal modes of flow, namely a steady laminar flow mode and a turbulent flow mode. In general, the unsteady laminar flow mode only occurs for a jet that is directed over certain limited distances and that has a certain Reynolds number ("Re") values within a range of values for Re. In an embodiment, the distance over which jet 70 is directed is predetermined distance 68. Predetermined distance 68 may be maintained between 5-7 centimeters (cm) which is a conventional distance between motherboards in a typical printed circuit board rack. For particular jet velocities for jet 70, at less than 5 cm there may be insufficient space within which the "buckling" or oscillation of jet 70 may occur and at greater than 7 cm, jet 70 may fail to retain sufficient momentum to allow the "buckling" or oscillation of jet 70 to occur. Consequently, in either case (below 5 cm or above 7 cm), jet 70 may not oscillate at particular jet velocities for jet 70.

The Reynolds number, Re, which is well known in the art, is defined as equaling the product of the hydraulic diameter (D), velocity (v) and density of the gas/liquid ($\rho$) of the jet, divided by the viscosity ($\mu$) of the gas/liquid, where the hydraulic diameter, D, is double the length 78 of opening 62 (i.e., equaling double the width of jet 70). In this scenario, the jet velocity (v) is 0.4725 m/s, the hydraulic diameter (D) is 0.02 m, the density ($\rho$) is approximately 1.16 kg/m$^3$ (at 27 degrees Celsius), and the viscosity ($\mu$) is approximately $1.85 \times 10^{-5}$ (at 27 degrees Celsius). Thus, a computed Reynolds number for this embodiment is approximately 600. The Reynolds number may be maintained between 550 and 750 because at less than 550, the flow of jet 70 may be steady laminar, whereas at greater than 750 the flow of jet 70 may be turbulent. Accordingly, a Reynolds number within a range of values between 550 and 750 can yield the desired unsteady laminar flow characteristic.

In the example set forth above, the hydraulic diameter (D) is 2 cm, which is double length 78 of opening 62. Additionally, a length 112 of each of material layer 52 and target element 56 is significantly longer than that of slotted opening 78, for example 10 cm, 30 cm, or more. A narrow, rectangular slot is employed at opening 62 so that the "buckling" or oscillation of jet 70 about its axis 72 occurs within a plane, that is, so that the "buckling" will occur within or parallel to a plane formed by axis 72 and the long axis (generally the axis of the longest side, i.e., length 78) of opening 62. In alternate embodiments, in which opening 62 has a shape other than a rectangular slot, the oscillations of the jet 70 can occur in more than one dimension in a more complicated manner. Further in alternate embodiments, the opening 62 can be formed by a nozzle or other element rather than merely a slot within material layer 52.

In alternate embodiments, predetermined distance 68, the Reynolds number and the component factors of the Reynolds number including the shape and size of the opening 62, the velocity of jet 70, and the type of gas/liquid can be varied to get the desired "controlled jet" effect. However, although a variety of combinations are possible, the various dimensions of system elements, Reynolds number and coolant that are chosen must be set so that jet 70 operates in the unsteady laminar flow mode, i.e., the transition between the steady laminar flow mode and the turbulent flow mode.

Given predetermined distance 68 (i.e., the spacing between material layer 52 and target element 56), the Reynolds number and the component factors of the Reynolds number, including the shape and size of opening 62, the velocity of jet 70, and the density and viscosity of the coolant to be used (e.g., air), a frequency of "buckling" (oscillation frequency) of jet 70 about axis 72 is 12.96 Hz. The oscillation frequency is associated with the primary motion of jet 70 about its axis 72 induced by the recirculation vortices that move on both sides of jet 70. The oscillation frequency of jet 70 about its axis 72 is used to drive the sinusoidal frequency of output signals 84 and 86. That is, as shown in FIG. 6, a period 114 for each of output signals 84 and 86 is 77.16 msec, so as to yield the frequency of 12.96 Hz.

When transducers 58 and 60 are driven such that output signals 84 and 86 are produced at a sufficient amplitude and at a frequency that is substantially equivalent to the oscillation frequency of jet 70 and with a one hundred and eighty degree phase difference, the sweeping oscillation of stagnation point 46 (FIG. 1) that occurs in the prior art impinging jet system 20 (FIG. 1) is largely prevented. Thus, a tip 116, or a stagnation point, of jet 70 focuses at predetermined location 96 and its position remains largely non-varying over time.

Figure 6:
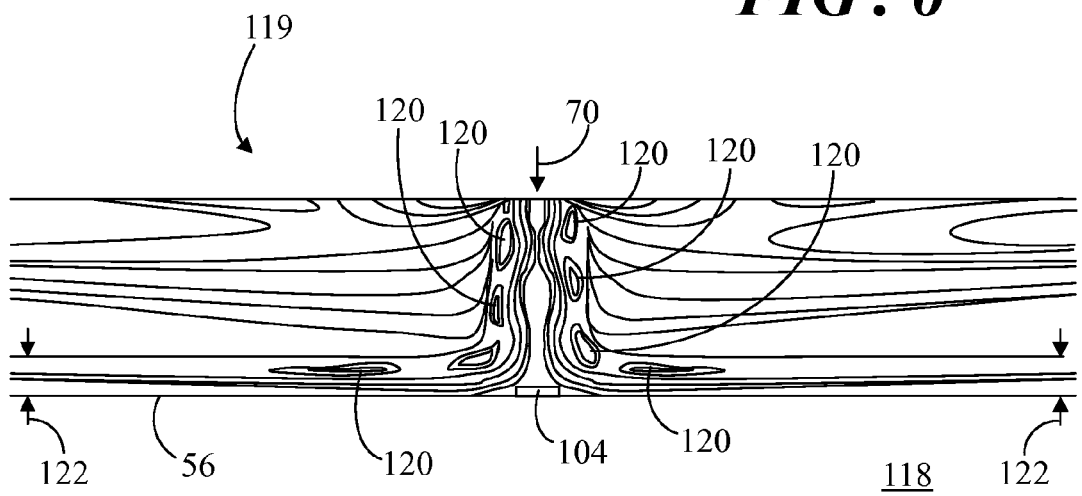
FIG. 6 shows a chart representing airflow variation and vortex formation at an instant in time formed in response to the controlled jet system of FIG. 3 operating in the overall cooling mode.

FIG. 6 shows a chart 118 representing airflow variation and vortex formation at an instant in time formed in response to controlled jet system 50 (FIG. 3) operating in an overall cooling mode 119. In this example, the jet velocity, or rate, is approximately 0.4725 m/s and the oscillation frequency of jet 70 is approximately twelve hertz. Accordingly, transducers 58 and 60 (FIG. 3) are actuated to produce output signals 84 and 86 (FIG. 3) at the oscillation frequency of jet 70 and one hundred and eight degrees out-of-phase relative to one another so that vortices 120 form. Like system 20 (FIG. 1), vortices 120, i.e., areas of high recirculation near opening 62 (FIG. 3) are formed when jet 70 "buckles" or oscillates back and forth about its axis 72 in the unsteady laminar flow mode (i.e., the transition between laminar and turbulent flow modes). However, due to output signals 84 and 86 (FIG. 3) perturbing jet 70 at the oscillation frequency of jet 70, vortices 120 substantially align in pairs on opposing sides 92, 93 (FIG. 3), i.e., the shear layer, of jet 70. That is, control of jet 70 aligns vortices 120 on both sides of the core of jet 70 (in the shear layer) so as to stabilize the core of jet 70.

This alignment of vortices 120 on the shear layer of jet 70 stabilizes the core of jet 70 by "driving" the flow of jet 70 in a more columnar manner so as to concentrate jet 70 at predetermined location 96 (FIG. 3). Moreover, since tip 116 (FIG. 3) is the point at which the greatest pressure of jet 70 is provided, the greatest amount of cooling will occur at predetermined location 96. In addition, as jet 70 impinges predetermined location 96, jet 70 spreads outwardly from predetermined location 96 in a generally uniform manner with the greatest coolant flow occurring across the surfaces of microelectronic devices 102 (FIG. 3).

Accordingly, perturbation of jet 70 by output signals 84 and 86 to control jet 70 can result in greatly increased localized cooling capability at predetermined location 96 and can further result in enhanced overall cooling of circuit 98 (FIG. 3) and microelectronic devices 102 (FIG. 3) that are displaced from predetermined location 96. This uniform cooling is represented by a generally linear outward airflow region 122 along target element 56. Thus, the "control" of jet 70 leads to significant heat transfer enhancement as the flow of jet 70 stabilizes and reaches highest momentum.

Figure 7:
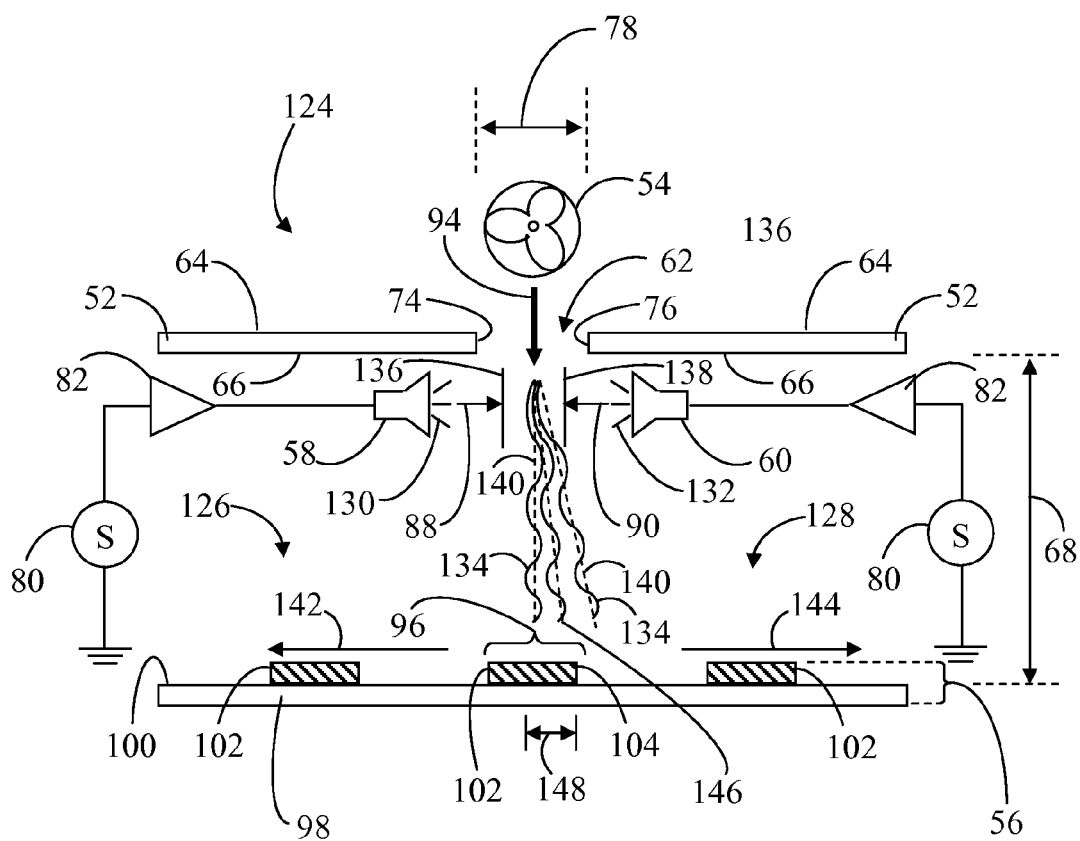
FIG. 7 shows the partial cross-sectional view of the controlled jet system of FIG. 3 operating in a partial cooling mode.

FIG. 7 shows the partial cross-sectional view of controlled jet system 50 operating in a partial cooling mode 124. In some instances, uniform cooling of the entire surface 100 of target element 56 may not be needed. For example, a portion 126 of microelectronic devices 102 may dissipate more heat than another portion 128 of microelectronic devices 102 coupled to circuit board 98. Accordingly, it may be desirable to provide enhanced cooling capability to that portion 126 of microelectronic devices 102 that dissipates greater heat while concurrently cost effectively providing the enhanced cooling.

In response to actuation by signal source 80, transducers 58 and 60 produce respective output signals 130 and 132 for perturbing a jet 134. More particularly, projected direction 88 of output signal 130 faces projected direction 90 of output signal 132 on opposing sides 136, 138 of jet 134, where side 136 corresponds to end 74 of opening 62 and side 138 corresponds to end 76 of opening 62. In addition, projected directions 88 and 90 of respective output signals 130 and 132 are generally perpendicular to flow direction 94 of jet 134.

Output signals 130 and 132 control oscillation of jet 134 relative to its axis 140 in order to partially stabilize jet 134 for impingement at predetermined location 96 on target element 56. In an embodiment, jet 134 is generally concentrated at predetermined location 96 to provide maximum downward momentum of jet 134 at predetermined location 96. However, jet 134 radiates away from (i.e., spreads outwardly from) predetermined location 96 in a first direction 142 in a generally uniform manner so as to provide effective cooling of the higher heat dissipating portion 126 of microelectronic devices 102 that are displaced from predetermined location 96 in first direction 142. In addition, jet 134 radiates away from (i.e., spreads outwardly from) predetermined location 96 in a second direction 144 in a non-uniform manner that provides less effective, but sufficient, cooling of the lower heat dissipating portion 128 of microelectronic devices 102 that are displaced from predetermined location 96 in second direction 142.

Like output signals 74 and 86 (FIG. 3), each of output signals 130 and 132 is a sinusoidal signal corresponding to an oscillation frequency of jet 134. In addition, transducers 58 and 60 are actuated so that output signals 130 and 132 have a phase difference of approximately one hundred and eighty degrees (previously illustrated in FIGS. 5 and 6). Like jet 70 (FIG. 3), jet 134 also flows in an unsteady laminar flow mode. That is, jet 134 "buckles" or oscillates back and forth about its axis 140 so that its central core is not always parallel to axis 140. However, unlike the fully "locked" (i.e., non-varying over time) position of jet 70, jet 134 is "locked" in first direction 142 but has a sweeping or flapping motion in second direction 144. As such, a tip, or stagnation point 146, of jet 134 "sweeps" or moves back and forth along its target, e.g., critical microelectronic device 104, in second direction 144 but not in first direction 142. This single direction sweeping is represented in FIG. 7 by a bi-directional arrow 148. This single direction sweeping is further represented in FIG. 7 by showing multiple axes 140 about which jet 134 oscillates, each of multiple axes 140 representing a different instant in time and the multiple axes 140 being positioned at an approximate center of predetermined location 96 or displaced from the approximate center of predetermined location 96 toward second direction 144.

As discussed above, the unsteady laminar flow mode is a transitional mode of operation between a steady laminar flow mode and a turbulent flow mode, and this unsteady laminar flow mode only occurs for a jet that is directed over certain limited distances and that has a certain Reynolds number ("Re") value within a range of values for Re. In this scenario, the distance over which jet 70 is directed is predetermined distance 68 which may be maintained between 5-7 centimeters (cm). In addition, in order to operate in partial cooling mode 124, the jet velocity (v), or rate, of jet 134 is less than the jet velocity (v) of jet 70 in overall cooling mode 119 (FIG. 6). By way of example, the jet velocity (v) for partial cooling mode 124 is adjusted to 0.4325 m/s, whereas, the jet velocity (v) for overall cooling mode 119 is adjusted to 0.4725 m/s. Thus, with all other variables remaining the same, the hydraulic diameter (D) is 0.02 m, the density ($\rho$) is approximately 1.16 kg/m$^3$ (at 27 degrees Celsius), and the viscosity ($\mu$) is approximately 1.85×10$^{-5}$ (at 27 degrees Celsius). Accordingly, a computed Reynolds number for this embodiment is approximately 550 which yields the desired unsteady laminar flow characteristic, but at the lower end of the range for the unsteady laminar flow mode.

Given predetermined distance 68 (i.e., the spacing between material layer 52 and target element 56), the Reynolds number and the component factors of the Reynolds number, including the shape and size of opening 62, the velocity of jet 134, and the density and viscosity of the coolant to be used (e.g., air), a frequency of "buckling" (oscillation frequency) of jet 134 about its axis 136 is approximately 10.68 Hz. The oscillation frequency is associated with the primary motion of jet 134 about its axis 140 induced by the recirculation vortices that move on opposing sides 136, 138 of jet 134. The oscillation frequency of jet 134 about its axis 140 is used to drive the sinusoidal frequency of output signals 130 and 132. Accordingly, a perturbation frequency of sinusoidal output signals 130 and 132 is approximately 10.68 Hz for the partially controlled jet 134.

This unsteady laminar flow characteristic produced by the lower jet velocity (v) and a lower oscillation frequency, relative to overall cooling mode 119, provides the desired uniform cooling in first direction 126 and the non-uniform cooling in second direction 128. Furthermore, the reduction in jet velocity (v) results in a reduction in power usage by pumping device 54 that provides jet 134, and a potential reduction in power usage by signal source 80 and signal amplifier 82 used to actuate transducers 58 and 60. In some embodiments, this power savings may be approximately ten percent relative to overall cooling mode 119 while still providing the desired cooling effect.

Figure 8:
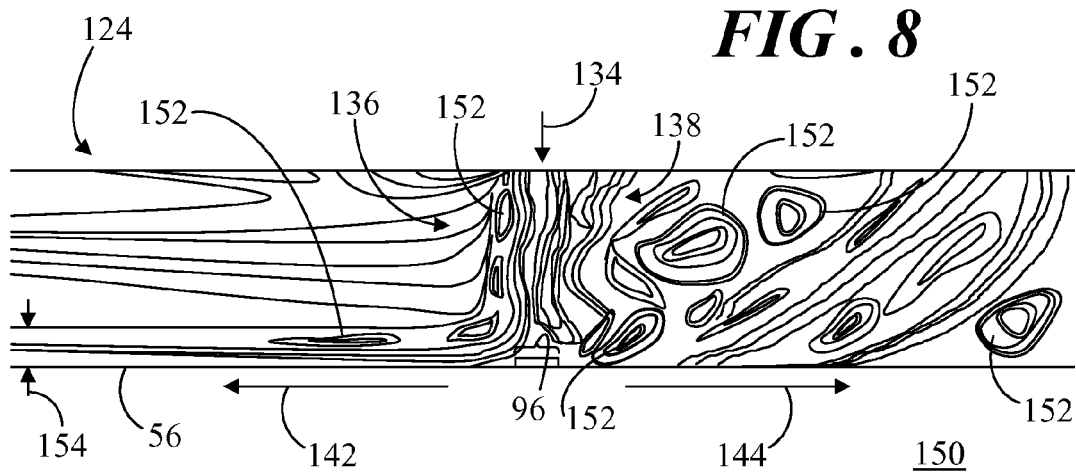
FIG. 8 shows a chart representing airflow variation and vortex formation at an instant in time formed in response to the controlled jet system operating in the partial cooling mode.

FIG. 8 shows a chart 150 representing airflow variation and vortex formation at an instant in time formed in response to controlled jet system 50 (FIG. 3) operating in partial cooling mode 124. When transducers 58 and 60 (FIG. 3) produce output signals 130 and 132 (FIG. 7) at the oscillation frequency of jet 134 and one hundred and eight degrees out-of-phase relative to one another, vortices 152 form. Vortices 152, i.e., areas of high recirculation near opening 62 (FIG. 3) are formed when jet 134 "buckles" or oscillates back and forth about its axis 140 (FIG. 7) in the unsteady laminar flow mode (i.e., the transition between laminar and turbulent flow modes). However, due to output signals 130 and 132 (FIG. 7) perturbing jet 134 at the oscillation frequency of jet 134, vortices 152 on side 136 of jet 134 substantially align along side 136, i.e., the shear layer, of jet 134. That is, control of jet 134 aligns vortices 152 on side 136 so as to stabilize that side of jet 134. However, vortices 152 on side 138 of jet 134 are not aligned on side 138. Rather, vortices on side 138 of jet 134 separate from side 138 and exhibit a more random pattern leading to vortex recirculation on side 138 of jet 134.

Since stagnation point 146 (FIG. 7) is the point at which the greatest pressure of jet 134 is provided, the greatest amount of cooling will still occur at predetermined location 96. However, the alignment of vortices 152 on the shear layer of jet 134 stabilizes side 136 of jet 134 by "driving" the flow of jet 134 in a generally columnar manner. Accordingly, as jet 134 impinges predetermined location 96, jet 134 spreads outwardly from predetermined location 96 in first direction 142 in a generally uniform manner with the greatest coolant flow occurring across the surfaces of portion 126 (FIG. 7) of microelectronic devices 102 (FIG. 7). This uniform cooling is represented by a generally linear outward airflow region 154 along target element 56 in first direction 142.

Conversely, the non-alignment of vortices 152 on side 138 of jet 134 results in destabilization of side 138 of jet 134 so that jet 134 provides non-uniform cooling of portion 128 (FIG. 7) of microelectronic devices 102. Accordingly, jet 134 spreads outwardly from predetermined location 96 in second direction 144 in a non-uniform manner. This non-uniform cooling is represented by the random pattern of vortices over target element 56 in second direction 144.

Accordingly, perturbation of jet 134 by output signals 130 and 132 can result in localized cooling capability at predetermined location 96 and can further result in uniform cooling of portion 126 (FIG. 7) of microelectronic devices 102 displaced from location 96 in first direction 142, and non-uniform cooling of portion 128 (FIG. 7) of microelectronic devices 102 displaced from location 96 in second direction 144. Thus, the "partial control" of jet 134 leads to significant heat transfer enhancement in first direction 142 and sufficient heat transfer enhancement in second direction 144 as the flow of jet 134 stabilizes and reaches highest momentum. A judicious management of jet impinging system 50 (FIG. 3) with higher heat dissipating microelectronic devices 102 being located in first direction 142 and lower heat dissipating microelectronic devices 102 being located in second direction 144 can yield the desired cooling effect at lower power consumption, due to the lower required jet velocity of jet 134, relative to overall cooling mode 119 (FIG. 6).

Figure 9:
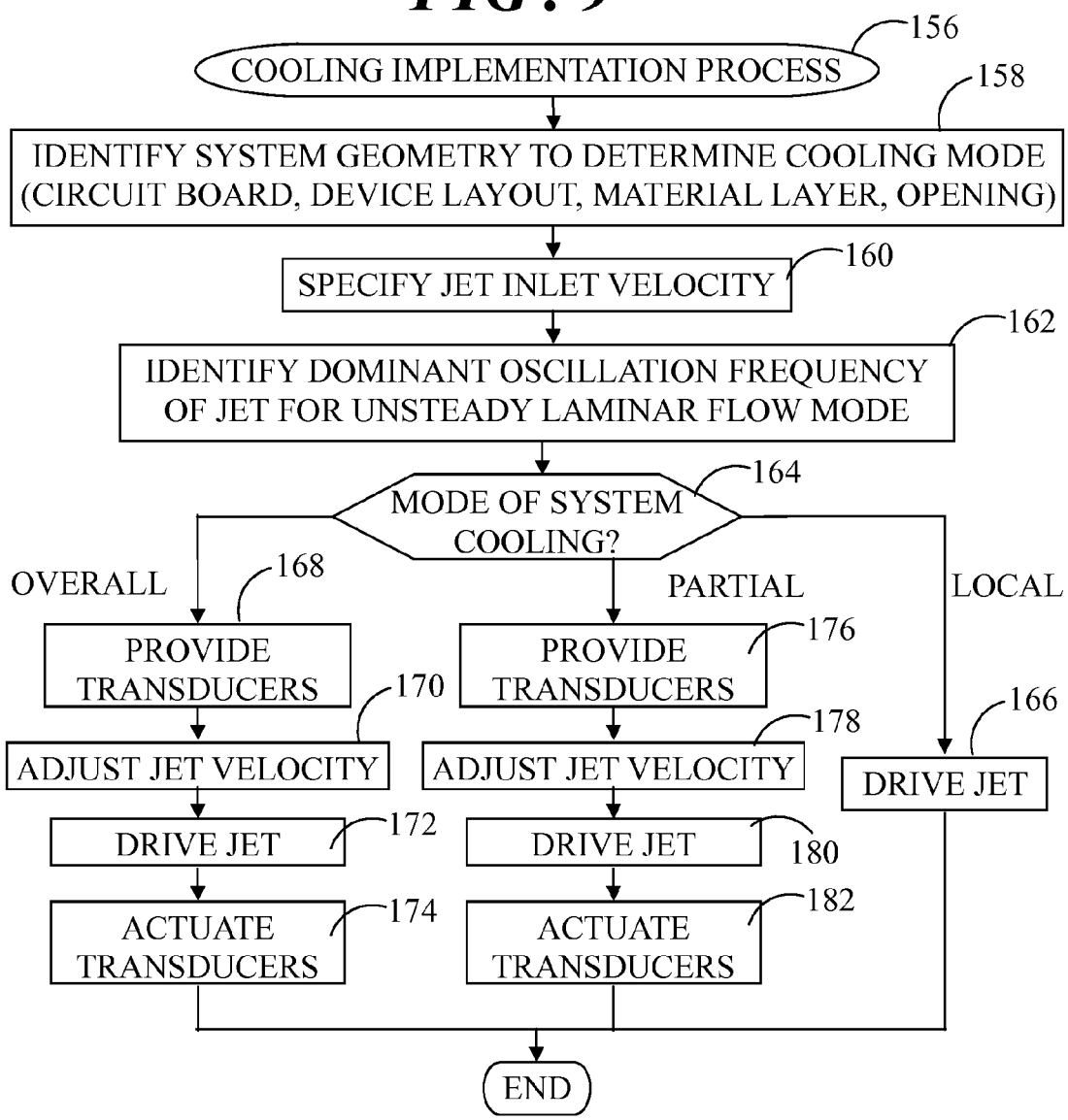
FIG. 9 shows a flowchart of a cooling implementation process.

FIG. 9 shows a flowchart of a cooling implementation process 156. Process 156 describes methodology in which a manufacturing facility, design team, and the like can determine and implement an appropriate cooling technique for a particular hardware configuration. Process 156 is provided for exemplary purposes. Those skilled in the art should understand, however, that the process steps discussed below can take on a great number of variations and can be performed in a differing order then that which is presented.

Cooling implementation process 156 begins with a task 158. At task 158, the system geometry is identified in order to determine an optimal cooling mode for the system. Such identification criteria includes, for example, the layout of microelectronic devices 102 (FIG. 3) on circuit board 98 (FIG. 3), the overall heat production of circuit board 98, identification of one or more "critical" microelectronic devices 104 (FIG. 3) on circuit board 98, identification of higher heat dissipating microelectronic devices 102 located at particular areas of circuit board 98 relative to other microelectronic devices 102 located on circuit board 98. Further identification criteria includes the layout of microelectronic devices (if any) on material layer 52 (FIG. 3), the creation of opening 62, the arrangement of material layer 52 substantially parallel to circuit board 98 and separated by predetermined distance 68 (FIG. 3), and so forth.

Following task 158, a task 160 is performed. At task 160, the inlet velocity for either of jet 70 (FIG. 3) or jet 134 (FIG. 7) is specified. The inlet velocity is the velocity of jet 70 or 134, i.e., the jet velocity, as it passes through opening 62 and into the space between material layer 52 and circuit board 98. In the examples discussed above, an inlet velocity of jet 70 (FIG. 3) for overall cooling mode 119 (FIG. 6) was suggested as being 0.4725 m/s, and an inlet velocity of jet 134 (FIG. 7) for partial cooling mode 124 (FIG. 7) was suggested as being 0.4325 m/s. However, it should be understood from the above discussion, that an appropriate inlet velocity (in combination with the size of opening 62, the density and viscosity of the coolant) should be selected to obtain a Reynolds number, in combination with the spacing between material layer 52 and circuit board 98, sufficient to cause the unsteady laminar flow mode of jets 70 and 134.

Figure 2:
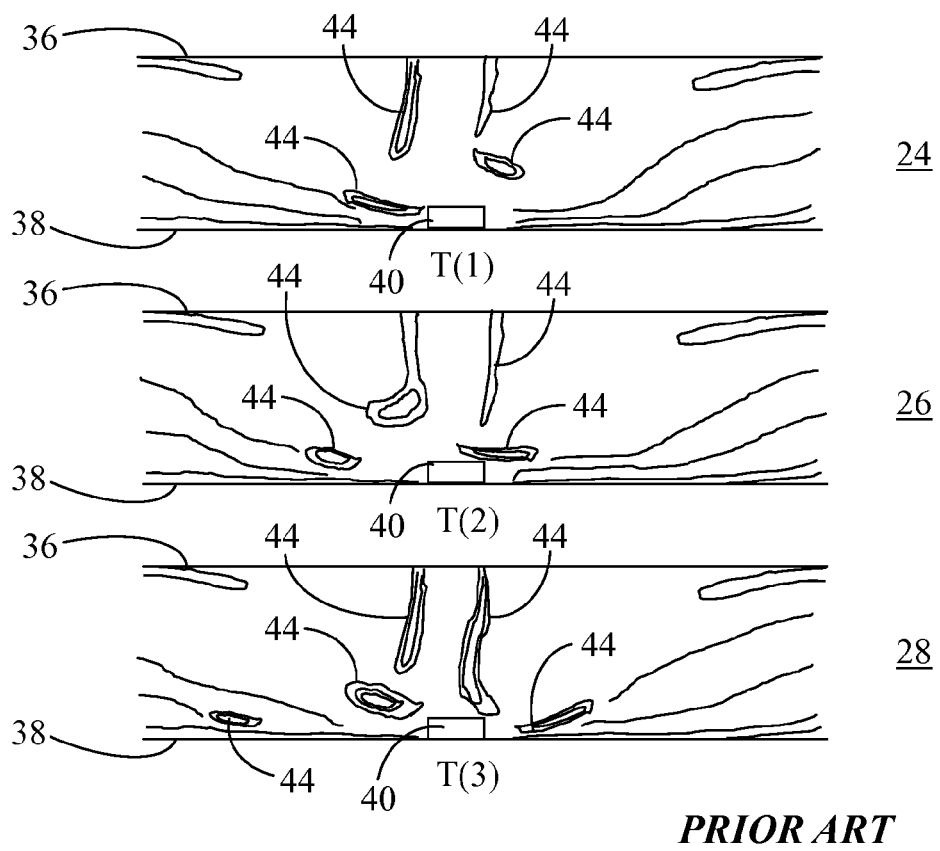
FIG. 2 shows a series of charts representing airflow variation and vortex formation relative to time in the cross-sectional view of the prior art uncontrolled impinging jet system cooling the microelectronic devices.

Next, a task 162 is performed. At task 162, the dominant oscillation frequency of jet 70 or jet 134 is identified for the unsteady laminar flow mode. In the examples discussed above, the dominant oscillation frequency of jet 70 is 12.96 Hz and the dominant oscillation frequency of jet 134 is 10.68 Hz. However, is should be understood that with different geometric configurations and/or different values of the Reynolds number, a different oscillation frequency of either of jets 70 and 134 may occur. One possible means for determining the oscillation frequency would be to drive either jet 70 or jet 134 through opening 62 in the identified geometric configuration without actuating transducers 58 and 60 (FIG. 3). Vortices 44 (FIG. 2) can then be detected and measured or otherwise counted to determine the oscillation frequency.

Figure 1:
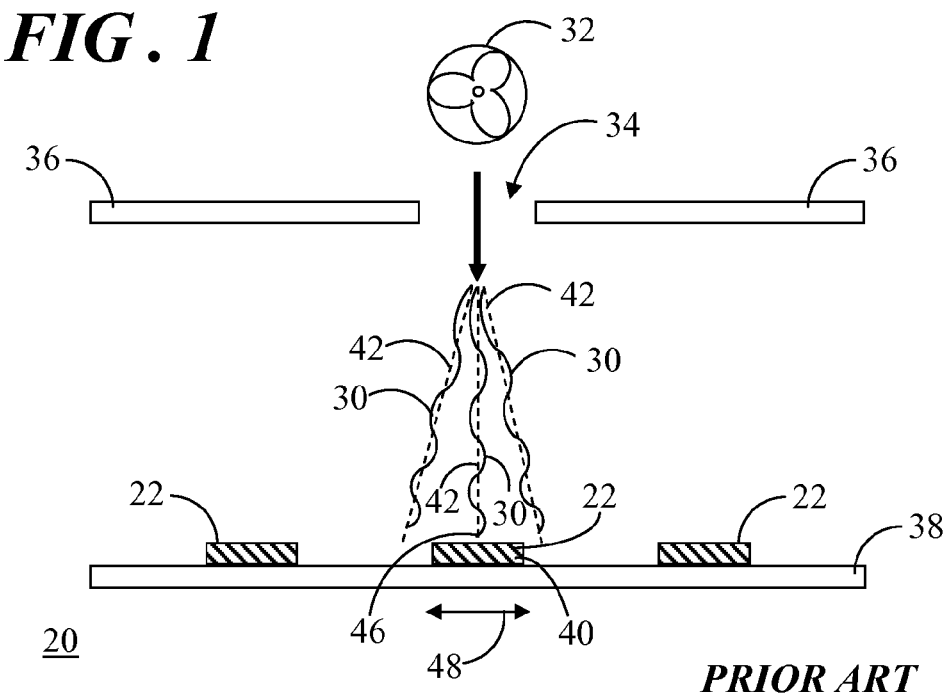
FIG. 1 shows a cross-sectional view of a prior art impinging jet system for cooling microelectronic devices.

Next, a query task 164 is performed. At task 164, a determination is made as to which of mode of cooling would be most suitable for the current design configuration. The modes of cooling discussed herein include overall cooling mode 119 (FIG. 6), partial cooling mode 124 (FIG. 7), and the uncontrolled jet technique. This determination is based upon information amassed through the execution of tasks 158, 160, and 162. When design requirements call for localized cooling at predetermined location 96 (FIG. 3) at query task 164, an uncontrolled jet technique may be implemented. As such, cooling implementation process 156 proceeds to a task 166. At task 166, jet 70 or jet 134 is driven through opening 62 (FIG. 3) and allowed to oscillate and "sweep" as discussed in connection with the prior art impinging jet system 20 (FIG. 1). Following task 166, cooling implementation process 156 exits.

When design requirements call for overall, or uniform, cooling at query task 164 with or without enhanced localized cooling at predetermined location 96 (FIG. 3), a controlled jet technique, more particularly, overall cooling mode 119 (FIG. 6), may be implemented. As such, cooling implementation process 156 proceeds to a task 168. At task 168, transducers 58 and 60 are provided and arranged proximate inner surface 66 (FIG. 3) of material layer 52 (FIG. 3) at ends 74 and 76 (FIG. 3) of opening 62.

Next, at a task 170, the inlet velocity, or jet velocity, of jet 70 is adjusted to the determined velocity. In this configuration, the inlet velocity of jet 70 is 0.4725 m/s.

Following task 170, a task 172 is performed. At task 172, jet 70 is driven through opening 62 (FIG. 3) and is allowed to oscillate. However, at a task 174, performed in connection with task 172, transducers 58 and 60 are actuated to produce output signals 84 and 86 (FIG. 3) at a perturbation frequency that is substantially equivalent to the oscillation frequency of jet 70 so as to perturb jet 70 to control the oscillation, or sweeping motion, of jet 70. Thus, jet 70 stabilized for impingement on critical microelectronic device 104 (FIG. 3) at predetermined location 96 and subsequently spreads from predetermined location 96 to provide substantially uniform cooling of microelectronic devices 102 (FIG. 3) coupled to surface 100 (FIG. 3) of circuit board 98 (FIG. 3). Following task 174, cooling implementation process 156 exits.

When design requirements call for partial, or non-uniform, cooling at query task 164 with or without enhanced localized cooling at predetermined location 96 (FIG. 3), a controlled jet technique, more particularly, partial cooling mode 124 (FIG. 7), may be implemented. As such, cooling implementation process 156 proceeds to a task 176. At task 176, transducers 58 and 60 are provided and arranged proximate inner surface 66 (FIG. 3) of material layer 52 (FIG. 3) at ends 74 and 76 (FIG. 3) of opening 62.

Next, at a task 178, the inlet velocity, or jet velocity, for jet 134 (FIG. 7) is adjusted to the determined velocity. In this configuration, the inlet velocity of jet 134 is 0.4325 m/s.

Following task 178, a task 180 is performed. At task 180, jet 134 is driven through opening 62 (FIG. 3) and is allowed to oscillate. However, at a task 182, performed in connection with task 180, transducers 58 and 60 are actuated to produce output signals 130 and 132 (FIG. 7) at a perturbation frequency that is substantially equivalent to the oscillation frequency of jet 134 so as to perturb jet 134 to partially control the oscillation, or sweeping motion, of jet 134. Thus, jet 134 is partially stabilized for impingement on critical microelectronic device 104 (FIG. 3) at predetermined location 96. Jet 134 subsequently spreads from predetermined location 96 in first direction 142 (FIG. 7) to provide substantially uniform cooling of portion 126 (FIG. 7) of microelectronic devices 102 coupled to surface 100 (FIG. 3) of circuit board 98 (FIG. 3) and displaced from predetermined location 96 in first direction 142. In addition, jet 134 subsequently spreads from predetermined location 96 in second direction 144 (FIG. 7) to provide non-uniform cooling of portion 128 (FIG. 7) of microelectronic devices 102 coupled to surface 100 of circuit board 98 and displaced from predetermined location 96 in second direction 144. Following task 182, cooling implementation process 156 exits.

An embodiment described herein comprises methodology for cooling a target element, such as microelectronic circuits coupled to a circuit board. A jet of coolant, such as air, is directed through an opening in a material layer toward a target element along an axis, the jet being made to oscillate or buckle about that axis. Transducers, positioned between the material layer and the target element, near the opening are actuated to perturb the jet in a direction substantially perpendicular to the jet. The flow of the jet is controlled through out-of-phase forcing at the dominant oscillation frequency for the unsteady laminar flow mode of the jet. The dominant oscillation frequency is determined from an inlet velocity of the jet and the separation between the target surface and an opening in a material layer through which the jet passes. In a partial cooling mode, control of the jet stabilizes one side of the jet while allowing the opposing side of the jet to separate. The partial cooling mode for the circuit board results in uniform dispersion of the jet in one direction following its impingement on the surface of the target element and non-uniform dispersion of the jet in the opposing direction. In an overall cooling mode, control of the jet stabilizes both sides of the jet to obtain maximum downward momentum. Thus, the jet is controlled at a higher velocity than the velocity of the jet for the partial cooling mode, and washes the target surface without separation, thereby enhancing overall cooling of the circuit board due to relatively uniform dispersion of the jet in both directions following its impingement on the surface of the target element. The methodology facilitates decision making when determining a particular cooling mode so as to provide cost effective flexibility in cooling capabilities.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for cooling a target element comprising:
   driving a jet of coolant from a back side of a material layer through an opening in said material layer for impingement with a predetermined location on said target element, said opening being a slot having a first end and a second end, said jet having a first side corresponding to said first end of said opening, and said jet having a second side corresponding to said second end of said opening; and
   actuating a first transducer to produce a first output signal for perturbing said jet said first transducer being positioned between said material layer and said target element and located at said first end of said opening; and
   actuating a second transducer to produce a second output signal for perturbing said jet, said second transducer being positioned between said material layer and said target element and located at said second end of said opening, said first and second output signals stabilizing said first side of said jet such that said jet provides substantially uniform cooling of said target element in a first direction radiating away from said predetermined location, and said first and second output signals destabilizing said second side of said jet such that said jet provides non-uniform cooling of said target element in a second direction radiating away from said predetermined location.

2. A method as claimed in claim 1 wherein said target element includes a support structure and microelectronic devices coupled to said support structure, and said jet spreads outwardly from said predetermined location to provide said substantially uniform cooling of a first portion of said microelectronic devices coupled to said support structure and displaced from said predetermined location in said first direction and to provide said non-uniform cooling of a second portion of said microelectronic devices coupled to said support structure and displaced from said predetermined location in said second direction.

3. A method as claimed in claim 2 wherein said target element further includes one of said microelectronic devices coupled to said support structure at said predetermined location, said jet provides localized cooling of said first microelectronic device at said predetermined location.

4. A method as claimed in claim 2 wherein said first portion of said microelectronic devices dissipate heat and said second portion of said microelectronic devices dissipate less heat than said first portion of said microelectronic devices.

5. A method as claimed in claim 1 wherein:
   said driving operation drives said jet at an oscillation frequency relative to its axis; and
   said actuating operations produce said first and second output signals that perturb said jet at a perturbation frequency that is substantially equivalent to said oscillation frequency.

6. A method as claimed in claim 5 wherein said material layer is spaced apart from said target element by a predetermined distance, said oscillation frequency is a function of said predetermined distance and a velocity of said jet through said opening, and said method comprises adjusting said velocity of said jet prior to said driving operation to obtain said oscillation frequency.

7. A method as claimed in claim 6 wherein when said predetermined distance is approximately six centimeters, said adjusting operation adjusts said velocity to obtain said oscillation frequency in a range of ten to eleven hertz.

8. A method as claimed in claim 1 wherein said first and second transducers are positioned above said predetermined location on said target element so that a first projected direction of said first output signal faces a second projected direction of said second output signal, and said actuating said first and second transducers further comprises providing said first and second output signals in the form of sinusoidal signals exhibiting a phase difference of approximately one hundred and eighty degrees.

9. A method as claimed in claim 1 further comprising:
   adjusting a velocity of said jet through said opening to a first rate when a mode of cooling for said target element is a partial cooling mode, and performing said driving and actuating operations; and adjusting said velocity of said jet through said opening to a second rate when said mode of cooling for said target element is an overall cooling mode, said second rate being greater than said first rate, and performing said driving and actuating operations.

10. A method as claimed in claim 9 wherein a predetermined distance between said opening and said predetermined location, a size of said opening, and said velocity at which said jet is driven through said opening causes said jet to flow in an unsteady laminar flow mode in either of said partial cooling mode and said overall cooling mode, and:
when in said partial cooling mode, said adjusting operation adjusts said velocity of said jet to said first rate such that perturbation of said jet by said first and second output signals cause said tip of said jet to be substantially non-varying in position in said first direction and to be varying in position in said second direction relative to time; and
when in said overall cooling mode, said adjusting operation adjusts said velocity of said jet to said second rate such that perturbation of said jet by said first and second output signals cause a tip of said jet to be substantially non-varying in position over time.

11. A method as claimed in claim 9 further comprising performing said driving operation and abstaining from performing said actuating operation when said mode of cooling for said target element is a local cooling mode, said driving operation directing said jet toward said target element, and a tip of said jet oscillating with respect to said target element so that said jet impinges a variety of locations on said target element.

12. A method for cooling microelectronic devices coupled to a support structure comprising:
driving a jet of coolant from a back side of a material layer through an opening in said material layer for impingement with a predetermined location on said support structure, said opening being a rectangular slot having first and second ends, said jet having a first side corresponding to said first end of said opening, said jet having a second side corresponding to said second end of said opening, and said jet being driven at an oscillation frequency relative to its axis; and
actuating a first transducer to produce a first output signal for perturbing said jet at a perturbation frequency that is substantially equivalent to said oscillation frequency, said first transducer being positioned between said material layer and said support structure and located at said first end of said opening; and
actuating a second transducer to produce a second output signal for perturbing said jet at said perturbation frequency, said second transducer being positioned between said material layer and said support structure and located at said second end of said opening, said first and second output signals stabilizing said first side of said jet such that said jet provides substantially uniform cooling of a first portion of said microelectronic devices coupled to said support structure and displaced from said predetermined location in a first direction, and said first and second output signals de-stabilizing said second side of said jet such that said jet provides non-uniform cooling of a second portion of said microelectronic devices coupled to said support structure and displaced from said predetermined location in a second direction.

13. A method as claimed in claim 12 wherein said first portion of said microelectronic devices dissipate heat and said second portion of said microelectronic devices dissipate less heat than said first portion of said microelectronic devices.

14. A method as claimed in claim 12 wherein said material layer is spaced apart from said support structure by a predetermined distance, said oscillation frequency is a function of said predetermined distance and a velocity of said jet through said opening, and said method comprises:
adjusting said velocity of said jet prior to said driving operation to obtain said oscillation frequency; and
adjusting said perturbation frequency of said first and second output signals to substantially match said oscillation frequency.

15. A method as claimed in claim 12 wherein said first and second transducers are positioned above said predetermined location on said support structure so that a first projected direction of said first output signal faces a second projected direction of said second output signal, and said actuating operation further comprises actuating said first and second transducers to provide said first and second output signals in the form of sinusoidal signals exhibiting a phase difference of approximately one hundred and eighty degrees.

16. A method for cooling microelectronic devices coupled to a support structure comprising:
adjusting a velocity of a jet of coolant to be driven from a back side of a material layer through an opening in said material layer to a first rate when a mode of cooling for said microelectronic devices coupled to said support structure is a partial cooling mode;
adjusting said velocity of said jet of coolant to a second rate when said mode of cooling for said microelectronic devices coupled to said support structure is an overall cooling mode, said second rate being greater than said first rate;
driving said jet of coolant through said opening at one of said first and second rates in accordance with one of said partial and overall cooling modes for impingement with a predetermined location on said support structure, said jet having a first side corresponding to a first end of said opening, and said jet having a second side corresponding to a second end of said opening;
actuating a first transducer positioned between said material layer and said support structure to produce a first output signal for perturbing said jet; and
actuating a second transducer positioned between said material layer and said support structure to produce a second output signal for perturbing said jet, wherein:
when in said partial cooling mode, said first and second output signals stabilize said first side of said jet such that said jet provides substantially uniform cooling of a first portion of said microelectronic devices coupled to said support structure and displaced from said predetermined location in a first direction, and said first and second output signals de-stabilize said second side of said jet such that said jet provides non-uniform cooling of a second portion of said microelectronic devices coupled to said support structure and displaced from said predetermined location in a second direction; and
when in said overall cooling mode, said first and second output signals stabilize said first and second sides of said jet such that said jet provides substantially uniform cooling of said microelectronic devices coupled to said support structure in both of said first and second directions.

17. A method as claimed in claim 16 further comprising performing said driving operation and abstaining from performing said actuating operation when said cooling mode for said microelectronic devices coupled to said support structure is a local cooling mode, said driving operation directing said jet toward said support structure.

18. A method as claimed in claim 16 wherein:
    said driving operation drives said jet at an oscillation frequency relative to its axis; and
    said actuating operations produce said first and second output signals, each of which perturbs said jet at a perturbation frequency perpendicular to its axis that is substantially equivalent to said oscillation frequency.

19. A method as claimed in claim 16 wherein said first and second transducers are positioned above said predetermined location on said support structure so that a first projected direction of said first output signal faces a second projected direction of said second output signal, and said actuating operation further comprises providing said first and second output signals in the form of sinusoidal signals exhibiting a phase difference of approximately one hundred and eighty degrees.

* * * * *